United States Patent [19]

Spencer

[11] 4,179,723
[45] Dec. 18, 1979

[54] KIOSK UNIT

[76] Inventor: Anthony Spencer, 340 Orienta Ave., Mamaroneck, N.Y. 10543

[21] Appl. No.: 765,682

[22] Filed: Feb. 4, 1977

[51] Int. Cl.$^2$ .......................... H05K 7/20; B05G 1/00
[52] U.S. Cl. .................................... 361/384; 361/334; 109/1 V; 109/24.1
[58] Field of Search ............... 361/334, 346, 379, 380, 361/381, 383, 384, 390; 174/16 R; 109/1 V, 19, 24.1

[56] References Cited

U.S. PATENT DOCUMENTS

| | | | |
|---|---|---|---|
| 2,042,848 | 6/1936 | Horn | 361/390 X |
| 2,843,806 | 7/1958 | O'Neill | 361/390 X |
| 2,912,066 | 11/1959 | Ellithorpe | 109/19 |
| 3,381,121 | 4/1968 | McDonald | 240/51.11 R |
| 3,897,901 | 8/1975 | Grosswiller, Jr. et al. | 109/24.1 |

Primary Examiner—J. D. Miller
Assistant Examiner—Peter S. Wong
Attorney, Agent, or Firm—Spellman, Joel & Pelton

[57] ABSTRACT

A self-contained Kiosk Unit comprises a unique self-supporting metal frame having a plurality of walls extending upwardly and forming a housing which includes a computer unit mounted therein. The controls for the computer unit are mounted in a recessed portion of the frame on a control panel while the functional portion of the computer is located within the housing. The base of the recessed portion forms a counter below the controls and the upper portion of the recess is equipped with suitable lighting to illuminate the controls and any advertising which might be contained on the frame itself. The frame extends outwardly over a metal pedestal which is an integral part of the housing structure and the outwardly extending portion of the base includes a predetermined number of perforations which permit a flow of air through the unit and upwardly through an aperture in the roof having a fan positioned therein for cooling purposes. The computer unit is mounted in the housing by means of a special hinge to permit service by security personnel while the roof portion permits access to a limited portion of the unit for servicing of some of the lesser important functions of the unit by maintenance personnel.

2 Claims, 5 Drawing Figures

KIOSK UNIT

BACKGROUND OF THE INVENTION

This invention relates to self-contained Kiosk type units and particularly to remote banking or credit card installations.

In order to accommodate their customers and attract new customers, banking institutions have recently installed so called "Automatic Teller Units", generally at their office locations. These units have a certain degree of novelty and, of course, convenience. An automatic unit permits a customer to insert a plastic identification card and obtain a predetermined sum of money by operating the controls. Other banking functions are of course possible at these installations. One drawback to such installations, however, is their location which is generally in the bank building itself rather than areas of heavy commercial traffic which would be more suited to such units. It appears that these automatic units have not been located by themselves due to security, cost and space factors as well as design considerations.

An important aspect of these units is the requirement for security since sums of money are involved in the transactions. While it is desired to place the units in areas of heavy traffic, it is also necessary to provide a unit which is secure against tampering or theft. Furthermore, the computer units which are generally used are expensive and should be protected. The present invention proposes a self-contained Kiosk type unit which may dispense either cash, travelers checks or any other predetermined item of value upon activation of a computer unit by a credit card or similar device. The unit may be located in a heavily traveled area such as an airport, railroad station, etc., since it is entirely self-contained. The frame comprises a unitary formed metal box type affair which is self-supporting and secure from any intrusion. Suitable ventilation for the computer unit which is mounted in a recessed portion thereof and the other equipment is provided by ventilation apertures in a protruding lip of the frame extending over a steel pedestal. The normal flow of air moves past the computer units and outwardly through a fan opening in the roof of the unit. The recessed portion of the unit includes a computer control panel mounted on the vertical wall thereof, while the bottom portion of the recess is substantially parallel to the ground and comprises a counter for customers. The overhanging portion of the recess is used for suitable lighting which may be contained therein to illuminate the counter and controls as well as any advertising which may be desired.

SUMMARY OF THE INVENTION

The present invention pertains to a remote banking or check dispensing unit which is self-contained. The unit comprises an attractive unitary metal frame which is self-supporting and mounted on a pedestal. A computer having a control panel is mounted therein so that a customer can insert a credit card or punch in desired instructions and receive either cash or checks from the unit. The control panel is mounted on the vertical wall of a recessed portion of the frame and the associated computer unit is secured therein by a special hinge arrangement so that the unit may be reached for servicing. The horizontal base of the recess is sufficiently above ground level so that it may be used for a counter while the overhanging roof portion of the recessed portion contains lighting for the unit.

The Kiosk unit embodies functional characteristics such as a unique ventilation system for the computer unit and security provisions so that only authorized personnel can service the computer unit. The roof contains a fan arrangement which can generally be serviced by anyone, but further access into the body of the unit is restricted by the structural design.

Accordingly, the object of this invention is to provide a new and improved remote type of banking unit.

Another object of this invention is to provide a self-contained banking unit comprising a unitary frame having a computer unit mounted therein.

A more specific object of this invention is to provide a remote type banking unit having suitable ventilation and lighting fixtures mounted within a self-supporting frame.

BRIEF DESCRIPTION OF THE DRAWINGS

Other objects and advantages may be seen from the following description when viewed in conjunction with the accompanying drawing wherein.

DETAILED DESCRIPTION OF THE INVENTION

Figure 1:
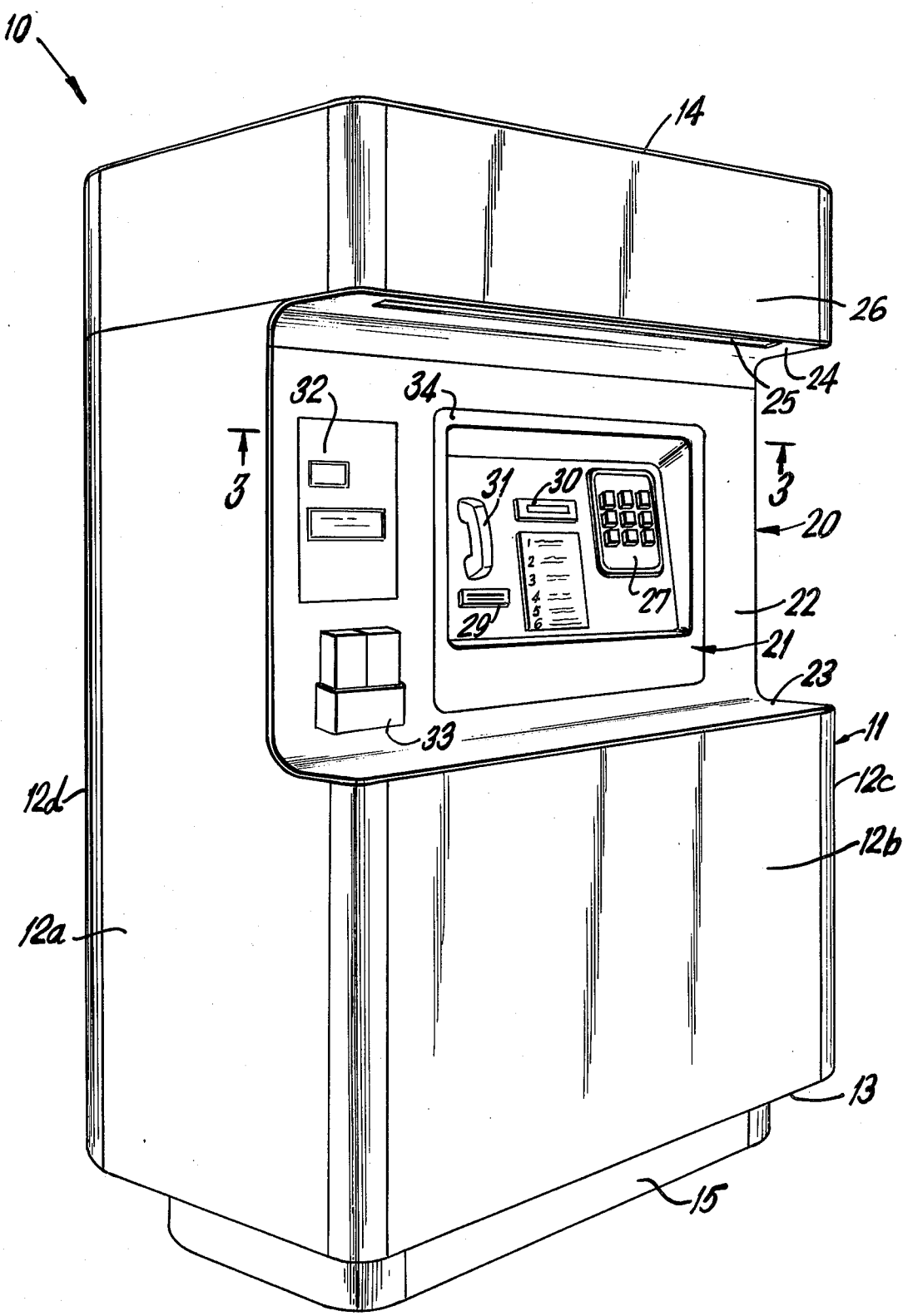
FIG. 1 is a perspective view of the new and improved remote unit comprising the present invention.
Figure 2:
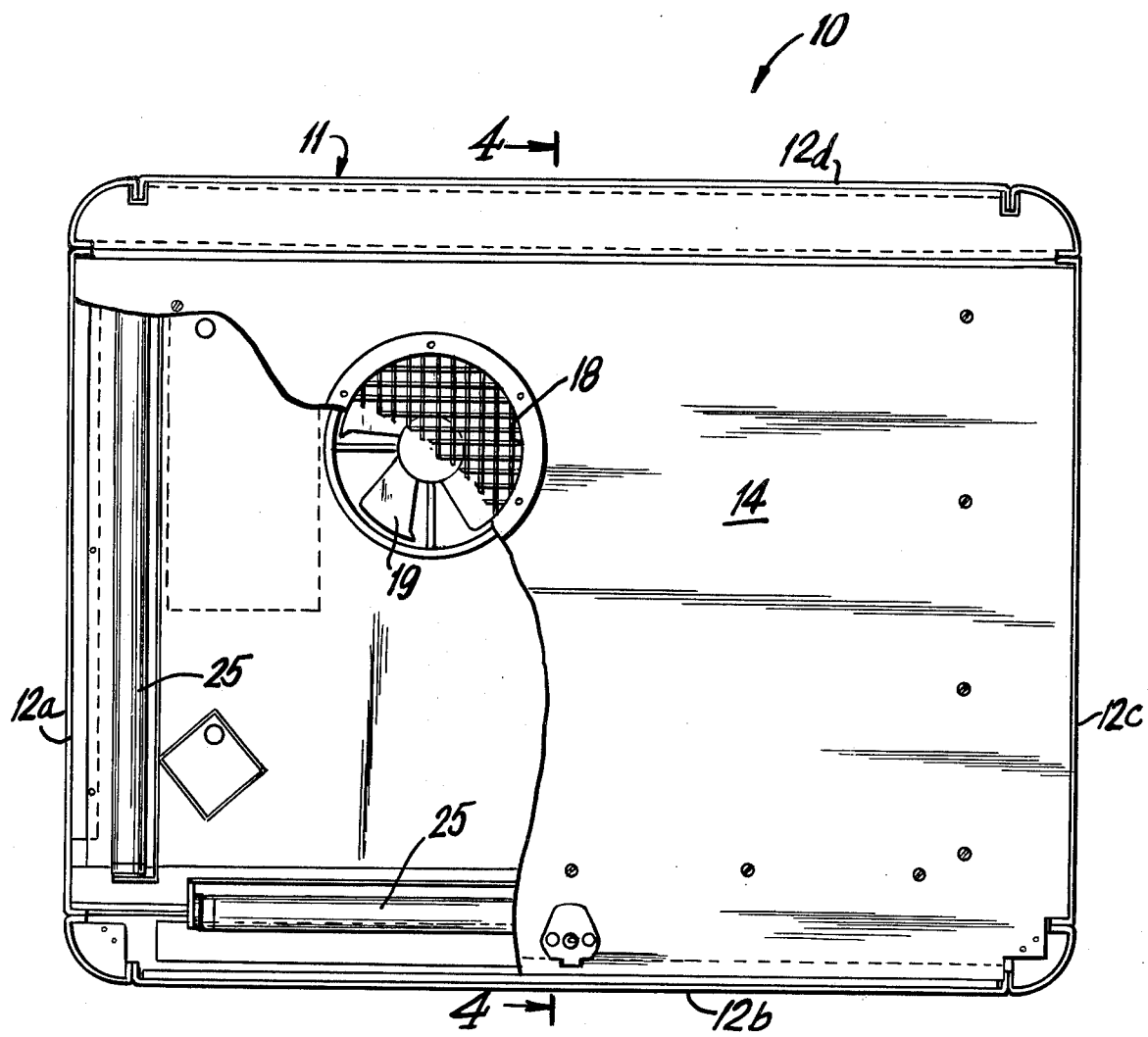
FIG. 2 is a top plan view of the invention, partially broken away.
Figure 3:
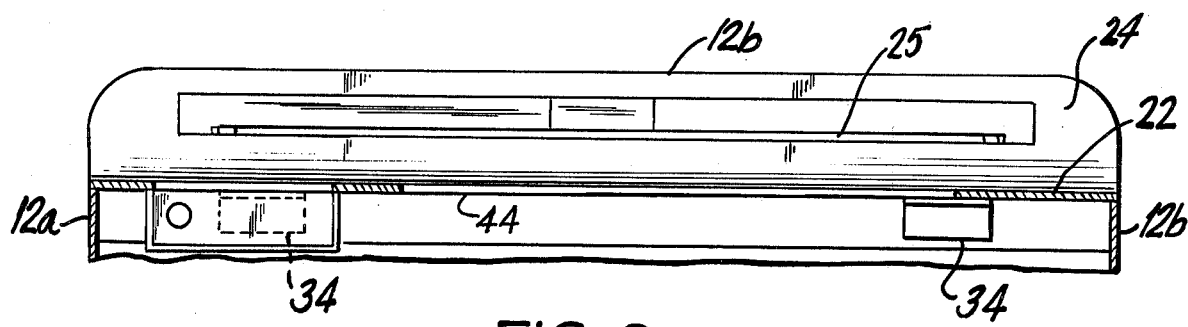
FIG. 3 is section view taken along the lines 3—3 of FIG. 1.
Figure 4:
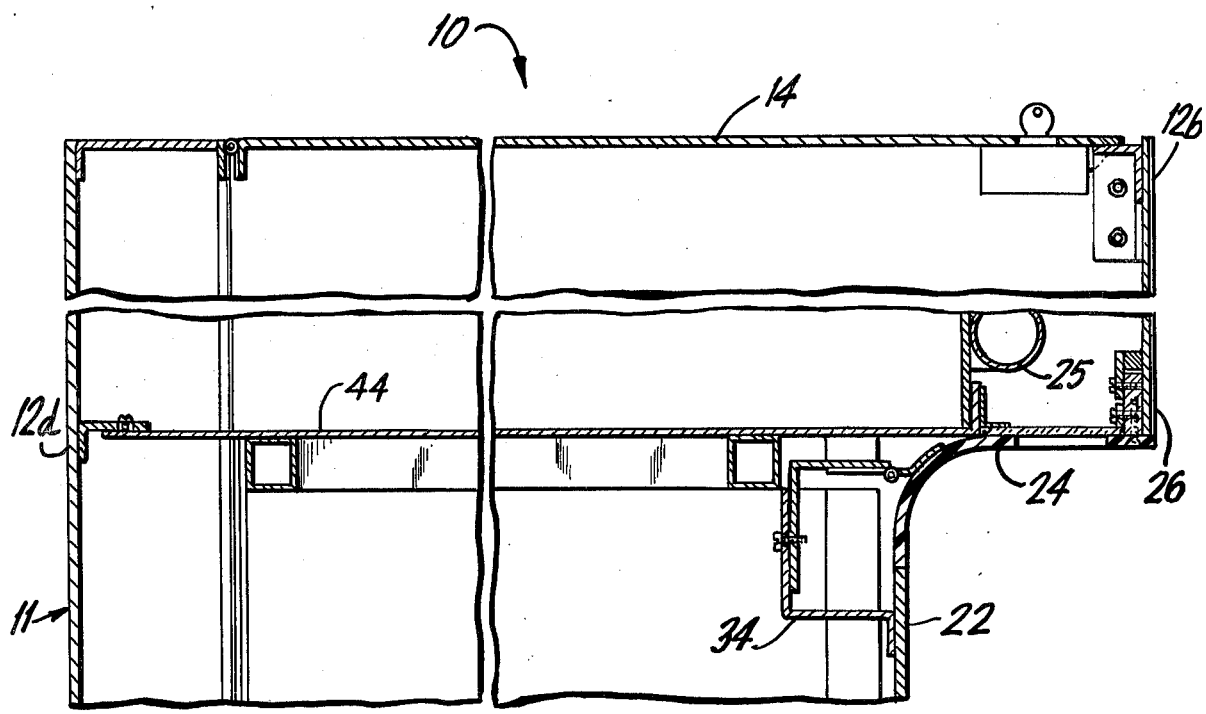
FIG. 4 is sections taken along the lines 4—4 of FIG. 1.
Figure 5:
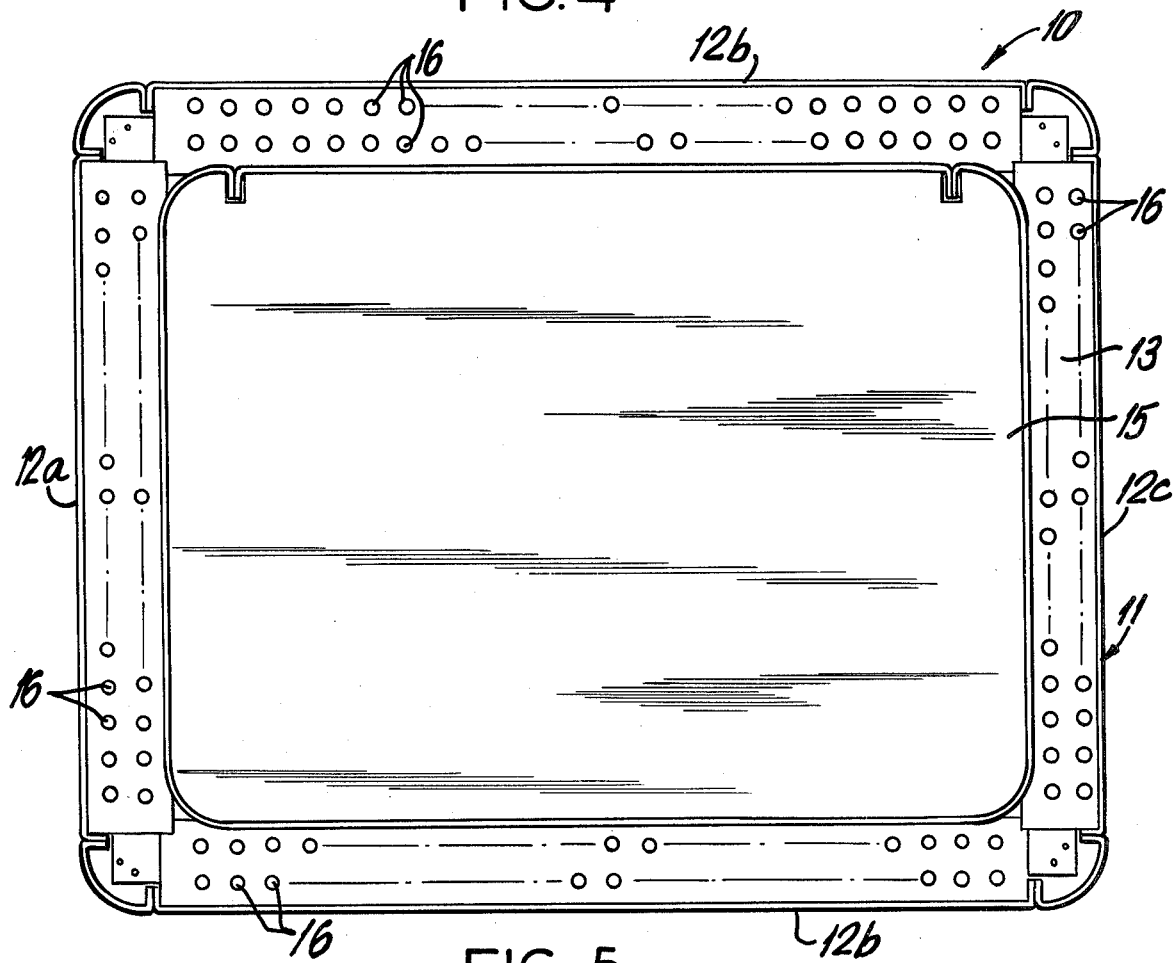
FIG. 5 is a bottom plan view of the invention.

Referring now to the drawings, the invention comprises a Kiosk type unit 10 for remote banking or credit card installations. The unit 10 is particularly suited for placement in heavy traffic areas such as airports, railway stations, etc., since it requires a minimum of space and no attending personnel. The unit 10 itself comprises a self-supporting metal frame 11 having a plurality of vertically extending walls 12 a,b,c, and d, a base 13 and a roof 14. The base 13 is mounted on a steel pedestal 15 and extends outwardly thereover forming a protruding lip portion.

The housing or frame 11 consists of 3/16 inch plate aluminum in a typical embodiment and for visual appearance an anodized mill finish is used. The base 13 includes a plurality of perforations 16 which direct a flow of air inwardly past the computer unit 17 for cooling and ventilating purposes and then upwardly through an aperture 18 having a fan 19 mounted therein. The operation of the fan 19 provides a suction effect drawing the air in through the perforations 16 and outward through the roof 14. A constant cooling stream is thereby generated.

The front wall 12b of the frame 11 is cut away to form a recessed portion 20 with a control panel 21 mounted in the vertical portion 22 thereof. The recessed portion 20 includes horizontal walls 23 and 24 which extend backwardly from the wall 12b to the vertical wall 22 at a distance apart. The horizontal wall 23 is at a predetermined distance above the base 13 and forms a counter for parties utilizing the Kiosk unit 10. The horizontal wall 24 extends outwardly from the wall 22 over the counter 23 and includes lighting elements 25 which illuminate the counter 23 and control panel 21. The lighting elements 25 may also be utilized to illuminate advertising on the overhanging portion 26 without requiring drastic design changes.

The control panel 21 includes a numerical or alphabetic punch arrangement 27 where certain instructions may be fed into the computer 28. On the panel, 21 aperture 29 is used for insertion of a credit card for identification purposes while aperture 30 is used for returning money, checks, etc. based upon the code communicated to the unit. A recording arrangement 31 is also included on the unit with a suitable speaker 35 mounted on the control panel 21. Space may also be provided for instructions 32 or handouts 33.

The control panel 21 is mounted with a particular hinge 34 so that it may be swung out of place for maintenance by security personnel. On the other hand, the roof 14 includes a bottom portion 44 which limits access to the interior of the unit 10 by maintenance individuals, therefore, a great deal of security is provided since only particular personnel have access to the computer unit 17 and the monetary or check supplies contained therein.

The resulting Kiosk unit 10 described above is extremely attractive and secure from vandalism and theft. It is most certainly an excellent merchandising and marketing facility for credit cards and banking transactions since it may be located in heavy traffic areas without the necessity of attending personnel.

While the invention has been explained by a detailed description of certain specific embodiments, it is understood that various modifications and substitutions can be made in any of them within the scope of the appended claims which are intended also to include equivalents of such embodiments.

I claim:

1. A self-contained Kiosk Unit comprises:
   a metal frame forming a self-supporting structure including vertical walls, a base and a roof, said frame having a recessed portion extending backwardly from one wall thereof to form a working counter, a vertical wall extending upwardly thereform, controls including communications means, identification means and withdrawal means mounted on said vertical wall and an overhanging portion extending from the recessed vertical wall to the frame wall,
   a pedestal upon which the base of said frame is mounted and extends outwardly thereover, said base portion including a predetermined number of perforations to permit a flow of air therethrough into the unit,
   a roof having an upper readily removable portion with an aperture therein and a fan mounted within said aperture to direct the flow of air outwardly from the unit and, a lower secure portion fixedly coupled to the frame and extending transversely across the frame in a plane corresponding substantially to the plane of the overhanging portion to restrict access to the interior of the unit, and
   a computer unit mounted within the frame with controls mounted on the face of the vertical recessed wall, said computer unit being hinged to the frame in a locked arrangement to permit ready access thereto by authorized personnel.

2. A Kiosk unit in accordance with claim 1 wherein:
   the metal frame comprises a formed unitary structure with reinforced corner portions to provide a secure tamper-proof structure and,
   the overhanging recessed portion includes lighting means to illuminate the controls and the counter.

Dedication

4,179,723.—*Anthony Spencer*, Mamaroneck, N.Y. KIOSK UNIT. Patent dated Dec. 18, 1979. Dedication filed June 20, 1980, by the inventor.
Hereby dedicates said patent to the People of the United States of America.
[*Official Gazette September 30, 1980.*]